United States Patent
Yasuda

(10) Patent No.: US 8,907,397 B2
(45) Date of Patent: Dec. 9, 2014

(54) NONVOLATILE SEMICONDUCTOR MEMORY DEVICE CONTAINING A MATERIAL HAVING AN OXYGEN DISSOCIATION CATALYTIC ACTION

(75) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 13/428,185

(22) Filed: Mar. 23, 2012

(65) Prior Publication Data

US 2013/0087845 A1    Apr. 11, 2013

(30) Foreign Application Priority Data

Oct. 7, 2011    (JP) ................................. 2011-222808

(51) Int. Cl.

| | |
|---|---|
| H01L 29/76 | (2006.01) |
| H01L 29/788 | (2006.01) |
| H01L 29/792 | (2006.01) |
| H01L 29/66 | (2006.01) |
| H01L 21/28 | (2006.01) |
| H01L 27/115 | (2006.01) |

(52) U.S. Cl.
CPC ...... *H01L 27/11582* (2013.01); *H01L 29/7926* (2013.01); *H01L 21/28282* (2013.01)
USPC .......... 257/314; 257/321; 257/324; 257/325; 257/326

(58) Field of Classification Search
None
See application file for complete search history.

(56) References Cited

U.S. PATENT DOCUMENTS

| | | | |
|---|---|---|---|
| 2008/0242051 A1* | 10/2008 | Yamazaki et al. | 438/458 |
| 2010/0072538 A1* | 3/2010 | Kito et al. | 257/326 |
| 2011/0294290 A1* | 12/2011 | Nakanishi et al. | 438/666 |
| 2011/0298037 A1* | 12/2011 | Choe et al. | 257/324 |

FOREIGN PATENT DOCUMENTS

| | | |
|---|---|---|
| JP | 2009-135324 | 6/2009 |
| WO | WO 2011/033637 A1 | 3/2011 |

OTHER PUBLICATIONS

Heiji Watanabe, "Roughness at $ZrO_2$/Si interfaces induced by accelerated oxidation due to the metal oxide overlayer", Applied Physics Letters, vol. 83, No. 20, Nov. 17, 2003, pp. 4175-4177.

* cited by examiner

*Primary Examiner* — Mamadou Diallo
*Assistant Examiner* — Jay C Chang
(74) *Attorney, Agent, or Firm* — Oblon, Spivak, McClelland, Maier & Neustadt, L.L.P.

(57) ABSTRACT

According to one embodiment, a method of manufacturing a nonvolatile semiconductor memory device is provided. In the method, a conductive film serving as a control gate is formed above a substrate. A hole extending through the conductive film from its upper surface to its lower surface is formed. A block insulating film, a charge storage layer, a tunnel insulating film, and a semiconductor layer are formed on the inner surface of the hole. A film containing a material having an oxygen dissociation catalytic action is formed on the semiconductor layer not to fill the hole. The interface between the tunnel insulating film and the semiconductor layer is oxidized through the film from the inside of the hole.

6 Claims, 6 Drawing Sheets

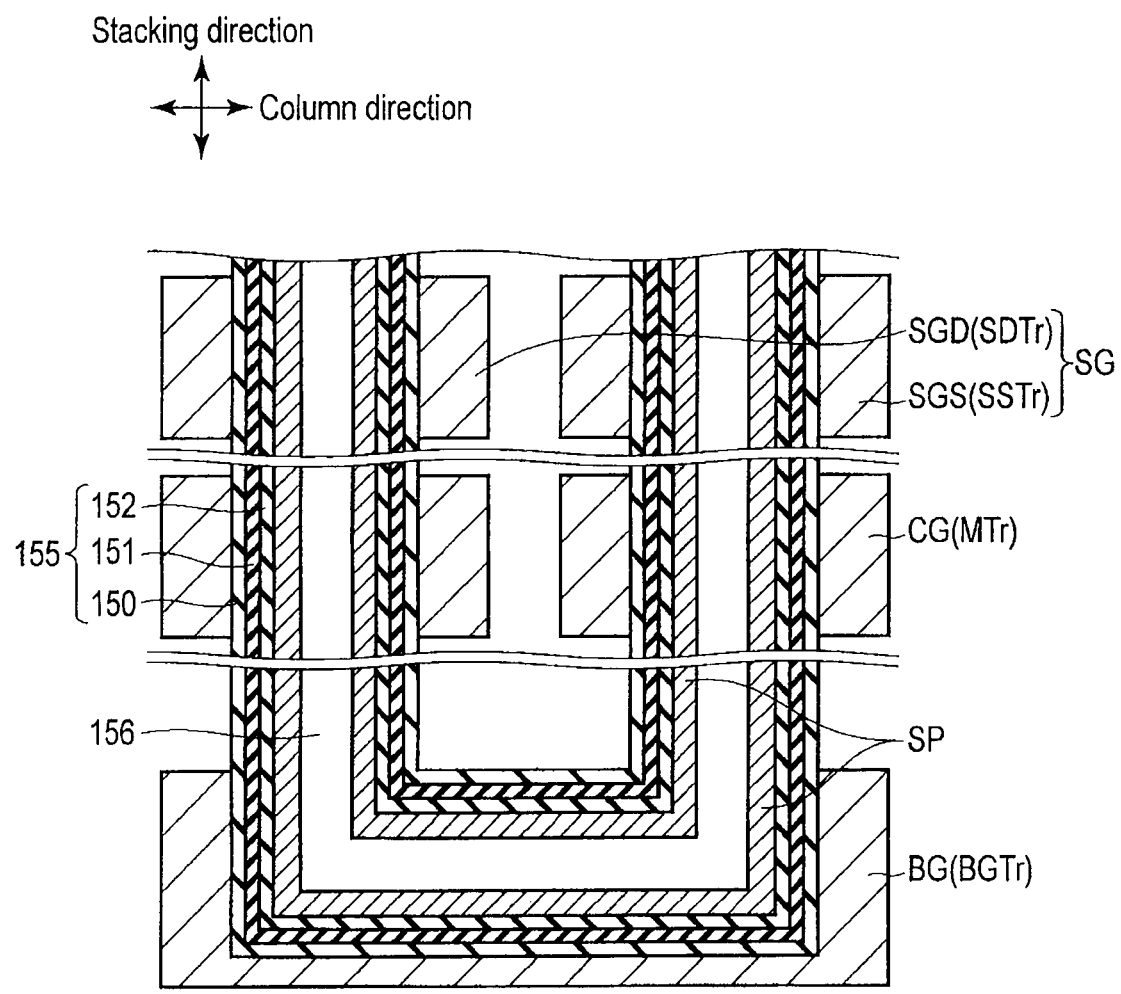
F I G. 3

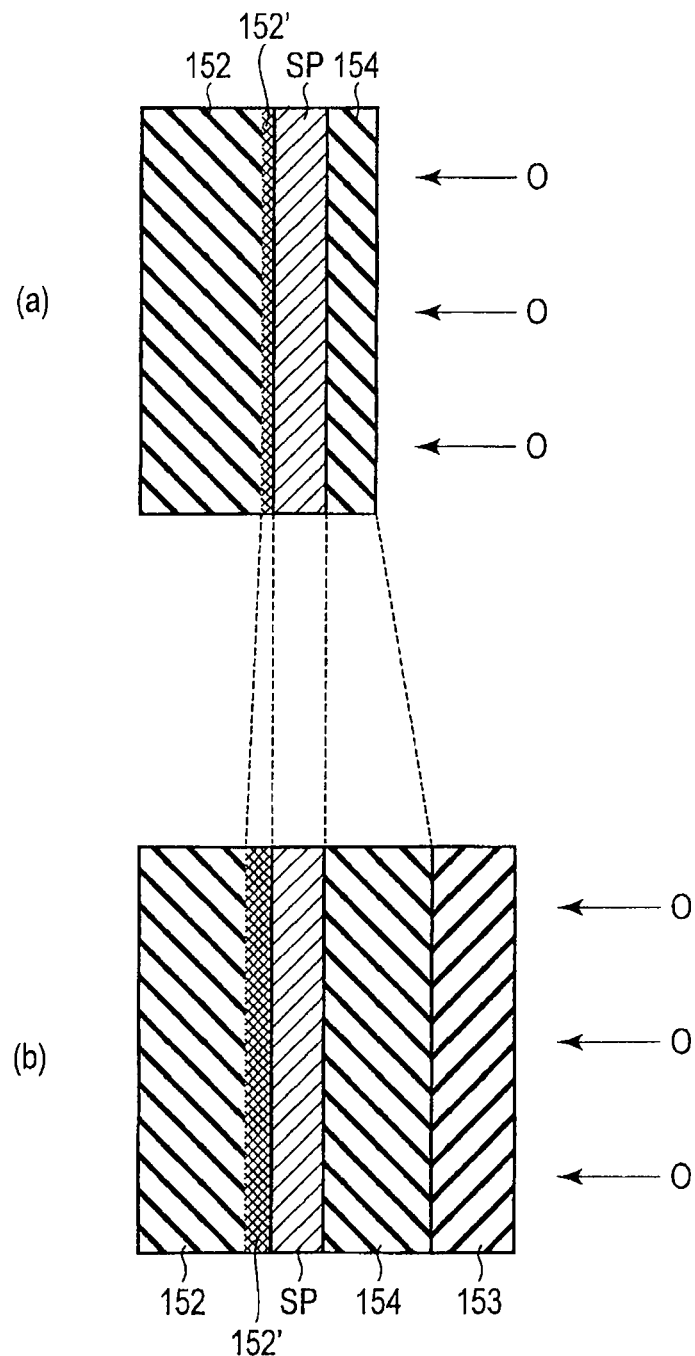
F I G. 8

NONVOLATILE SEMICONDUCTOR MEMORY DEVICE CONTAINING A MATERIAL HAVING AN OXYGEN DISSOCIATION CATALYTIC ACTION

CROSS-REFERENCE TO RELATED APPLICATIONS

This application is based upon and claims the benefit of priority from prior Japanese Patent Application No. 2011-222808, filed Oct. 7, 2011, the entire contents of which are incorporated herein by reference.

FIELD

Embodiments described herein relate generally to a nonvolatile semiconductor memory device and a method of manufacturing the same.

BACKGROUND

As a technique of increasing the density of a memory without depending on lithography, a structure in which an OTP (OneTime-Programmable) element is sandwiched between multilayer interconnections, a structure in which a plurality of layers of NAND flash memories are formed by repeating epitaxial growth of a silicon film, and the like have, for example, been proposed. However, these structures are problematic because the number of times of lithography increases along with an increase in the number of stacked layers. As an alternative technique, a 3D-stacked vertical memory has been proposed.

In the 3D memory, cylindrical holes (memory holes) are formed at once in a plurality of electrodes stacked on a semiconductor substrate. A memory film is formed on the inner wall of each hole. A polysilicon film (silicon pillar) is then formed in each hole. This allows to form at once memory strings formed from a plurality of MONOS memory cells connected in series in the stacking direction.

In the MONOS memory cells, many defects caused by shortage in oxygen and dangling bonds exist in the interface between the Si (silicon) layer and the tunnel insulating film (for example, $SiO_2$ film). These defects form interface states, resulting in a decrease in the carrier mobility or degradation of reliability.

To prevent this, a method has been proposed in which after Si layer formation, annealing is performed using an oxidizing gas to introduce oxygen into the interface between the Si layer and the tunnel insulating film. However, this annealing needs to be performed for a long time at a high temperature. Especially in the 3D memory, the annealing is done at the end of the MONOS memory cell manufacturing process. The annealing places a heavy thermal budget on the whole memory cells and consequently causes degradation of the memory cell characteristics and the like.

BRIEF DESCRIPTION OF THE DRAWINGS

FIG. 3 is an enlarged sectional view of a NAND string in FIG. 2;

FIG. 8 is views showing an oxidation enhancement effect obtained by a catalytic film according to the embodiment and a comparative example thereof.

DETAILED DESCRIPTION

Figure 1:
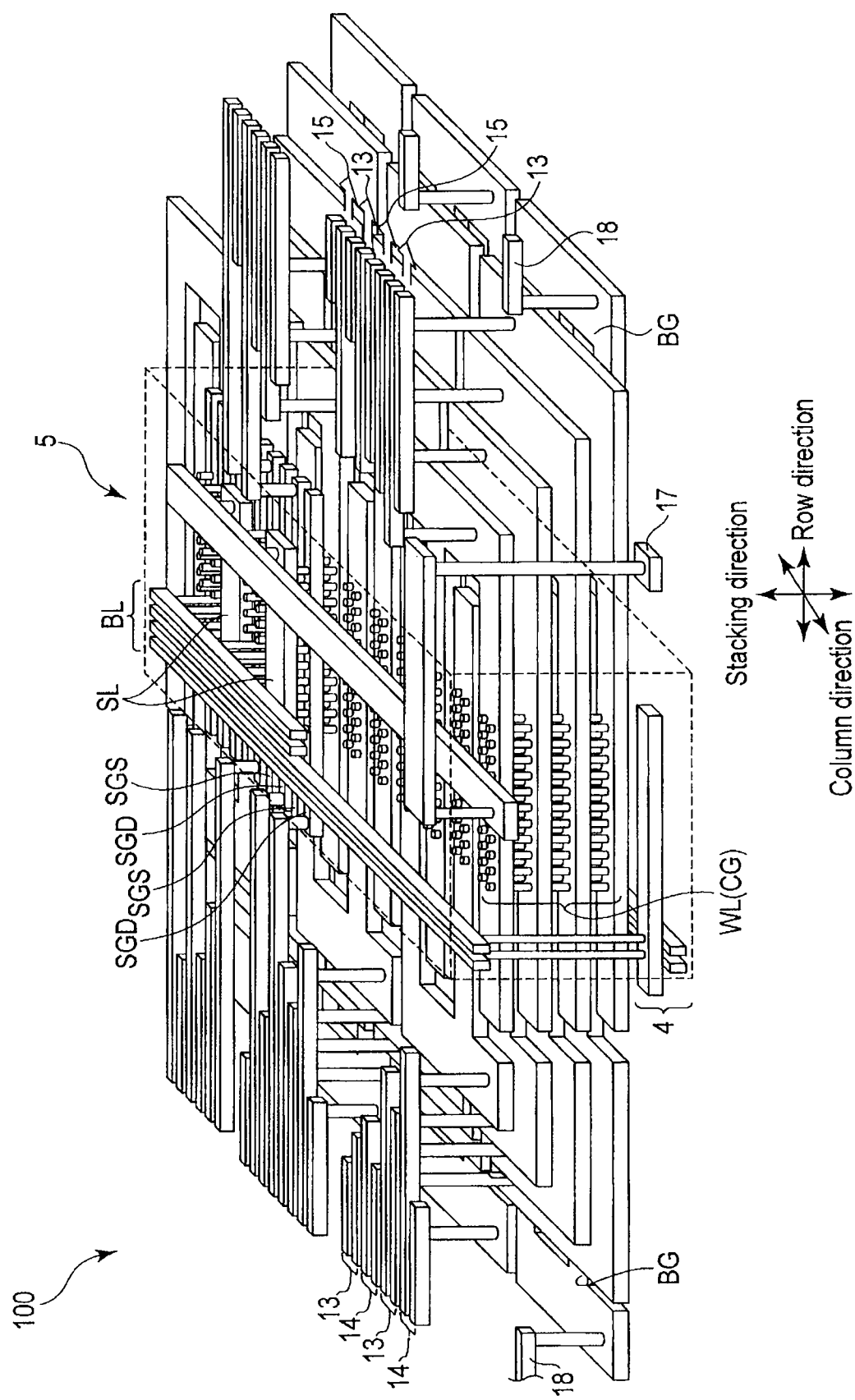
FIG. 1 is a perspective view showing an example of the overall arrangement of a nonvolatile semiconductor memory device according to the embodiment.

In general, according to one embodiment, a method of manufacturing a nonvolatile semiconductor memory device is provided. In the method, a conductive film serving as a control gate is formed above a substrate. A hole extending through the conductive film from its upper surface to its lower surface is formed. A block insulating film is formed on the inner surface of the hole. A charge storage layer is formed on the block insulating film. A tunnel insulating film is formed on the charge storage layer. A semiconductor layer is formed on the tunnel insulating film. A film containing a material having an oxygen dissociation catalytic action is formed on the semiconductor layer not to fill the hole. The interface between the tunnel insulating film and the semiconductor layer is oxidized through the film from the inside of the hole.

This embodiment will now be described with reference to the accompanying drawing. The same reference numerals denote the same parts throughout the drawing. A repetitive description will be done as needed.

<Example of Overall Arrangement>

An example of the arrangement of a nonvolatile semiconductor memory device (3D-stacked memory) according to the embodiment will be described below with reference to FIGS. 1, 2, and 3.

FIG. 1 is a perspective view showing an example of the overall arrangement of the nonvolatile semiconductor memory device according to the embodiment.

As shown in FIG. 1, a nonvolatile semiconductor memory device 100 comprises a memory cell array 5, a plurality of word line driving circuits 13, a plurality of source-side select gate driving circuits 14, a plurality of drain-side select gate driving circuits 15, a sense amplifier 4, a plurality of source line driving circuits 17, and a plurality of back gate transistor driving circuits 18.

The memory cell array 5 includes a plurality of word lines WL (control gates CG), a plurality of bit lines BL, a plurality of source lines SL, a plurality of back gates BG, a plurality of source-side select gates SGS, and a plurality of drain-side select gates SGD. In the memory cell array 5, memory cell transistors MTr for storing data are arranged at the intersections between the plurality of stacked word lines WL and U-shaped silicon pillars SP to be described later. Note that although FIG. 1 illustrates an example in which four layers of word lines WL are stacked, the embodiment is not limited to this.

The word line driving circuits 13 are connected to the word lines WL to control the voltages to be applied to the word lines WL. All interconnections for connecting the word line driving circuits 13 and the word lines WL are formed in the interconnection layer of the same level. Instead, the interconnections may be formed in interconnection layers of different levels.

The source-side select gate driving circuits 14 are connected to the source-side select gates SGS to control the voltages to be applied to the source-side select gates SGS.

The drain-side select gate driving circuits 15 are connected to the drain-side select gates SGD to control the voltages to be applied to the drain-side select gates SGD.

The sense amplifier 4 is connected to the bit lines BL to amplify the potential read from the memory cell transistors MTr. Bit line driving circuits (not shown) control the voltages to be applied to the bit lines BL.

The source line driving circuits 17 are connected to the source lines SL to control the voltages to be applied to the source lines SL. The source line driving circuits 17 are connected to all source lines SL. However, the embodiment is not limited to this, and each source line SL may be provided with one source line driving circuit.

The back gate driving circuits 18 are connected to the back gates BG to control the voltages to be applied to the back gates BG.

Figure 2:
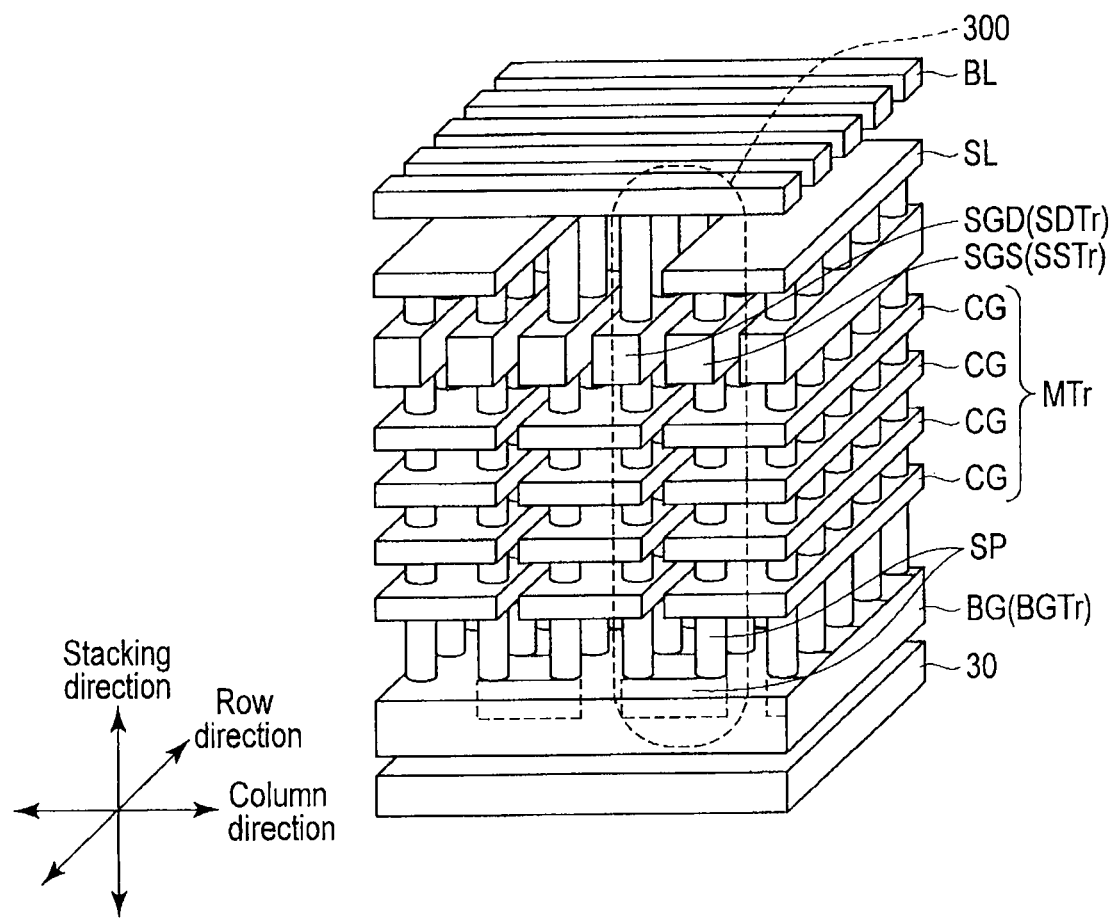
FIG. 2 is a perspective view showing a memory cell array in FIG. 1.

FIG. 2 is a perspective view showing the memory cell array 5 in FIG. 1 and illustrates the structure of NAND strings (memory cell strings) 300. FIG. 3 is an enlarged sectional view of the NAND string 300 in FIG. 2.

As shown in FIG. 2, in the memory cell array 5, the plurality of NAND strings (memory cell strings) 300 formed from U-shaped silicon pillars (semiconductor layers) SP are arranged on a semiconductor substrate 30. Each memory string 300 includes the plurality of memory cell transistors MTr whose current paths are formed in series along the U-shaped silicon pillar SP, and two select transistors (a drain-side select transistor SDTr and a source-side select transistor SSTr) formed at the two ends.

The plurality of memory cell transistors MTr are formed at the intersections between the U-shaped silicon pillars SP and the plurality of control gates CG, and have their current paths connected in series along the stacking direction. As shown in FIG. 3, each memory cell transistor MTr has a memory film 155 between the U-shaped silicon pillar SP and the control gate CG. The memory film 155 includes a tunnel insulating film 152, a charge storage layer 151, and a block insulating film 150 which are sequentially formed around the U-shaped silicon pillar SP. That is, each memory cell transistor MTr is formed from the U-shaped silicon pillar SP, and the tunnel insulating film 152, the charge storage layer 151, the block insulating film 150 and the control gate CG that are formed around the U-shaped silicon pillars SP, and has a MONOS structure.

The drain-side select transistor SDTr is formed at the intersection between the U-shaped silicon pillar SP and a drain-side select gate SGD. On the other hand, the source-side select transistor SSTr is formed at the intersection between the U-shaped silicon pillar SP and a source-side select gate SGS. As shown in FIG. 3, each of the drain-side select transistor SDTr and the source-side select transistor SSTr has the MONOS structure, like the memory cell transistor MTr.

The drain-side select transistor SDTr and the source-side select transistor SSTr are formed above the plurality of memory cell transistors MTr, as shown in FIG. 2. The source-side select transistor SSTr has one terminal (drain) connected to one terminal (source) of the plurality of memory cell transistors MTr and the other terminal (source) connected to the source line SL. The drain-side select transistor SDTr has one terminal (source) connected to the other terminal (drain) of the plurality of memory cell transistors MTr and the other terminal (drain) connected to the bit line BL.

The U-shaped silicon pillar SP is formed into a U shape along a section in the column direction. The U-shaped silicon pillar SP includes a pair of pillar portions extending in the stacking direction and a pipe portion formed to connect the lower ends of the pair of pillar portions. The pipe portion is provided in the back gate BG to form a back gate transistor BGTr. The U-shaped silicon pillar SP is arranged such that the line connecting the central axes of the pair of pillar portions becomes parallel to the column direction. The U-shaped silicon pillars SP are arranged in a matrix within a plane defined by the row- and column-directions. As shown in FIG. 3, the U-shaped silicon pillar SP has a hollow structure 156. The hollow structure 156 is filled with an insulating material or a metal or remains hollow.

The plurality of control gates CG are stacked above the back gate BG while inserting interlayer dielectric films (not shown) between them, and arranged to be perpendicular to the pillar portions of the U-shaped silicon pillars SP. The control gates CG parallelly extend in the row direction. Each control gate CG is formed to be shared by two adjacent pillar portions (two pillar portions on the center side) out of the four pillar portions of the memory cell strings 300 adjacent in the column direction. As shown in FIG. 1, the row-direction ends of the plurality of stacked control gates CG are stepped, and a contact is connected to the upper surface of each step. In the column direction, the even-numbered control gates CG are connected to each other on the one-end side in the row direction, and the odd-numbered control gates CG are connected to each other on the other-end side in the row direction.

The back gate BG is formed on an insulating film (not shown) on the semiconductor substrate 30. The back gate BG is provided under the lowermost control gates CG. The back gate BG is formed to two-dimensionally spread in the row and column directions so as to cover the connection portions of the U-shaped silicon pillars SP.

The drain-side select gates SGD and the source-side select gates SGS are provided above the uppermost control gates CG. The drain-side select gates SGD and the source-side select gates SGS parallelly extend in the row direction. Each drain-side select gate SGD is formed to intersect one of the pillar portions of the U-shaped silicon pillar SP. Each source-side select gate SGS is formed to intersect the other pillar portion. The drain-side select gates SGD and the source-side select gates. SGS are isolated from each other in the column direction with a line-and-space configuration.

The source lines SL are provided above the source-side select gates SGS. Each source line SL is formed to be shared by two adjacent pillar portions out of the four pillar portions of the two memory strings 300 adjacent in the column direction. The source lines SL parallelly extend in the row direction and are isolated from each other in the column direction with a line-and-space configuration.

The plurality of bit lines BL are provided above the source lines SL. The bit lines BL parallelly extend in the column direction and are isolated from each other in the row direction with a line-and-space configuration.

Embodiment

The nonvolatile semiconductor memory device according to this embodiment will be described with reference to FIGS. 4, 5, 6, 7, and 8.

In this embodiment, in the method of manufacturing a 3D-stacked memory, a catalytic film 153 having an oxygen dissociation catalytic action is formed on the inner surface of each silicon pillar SP, and the interface between the tunnel insulating film 152 and the silicon pillar SP is oxidized through the catalytic film 153. This makes it possible to reduce annealing (lower the temperature and shorten the time) in the oxidation process and relax the thermal budget placed on the memory cells by the annealing.

The nonvolatile semiconductor memory device according to the embodiment will be described below in detail.

[Structure]

Figure 4:
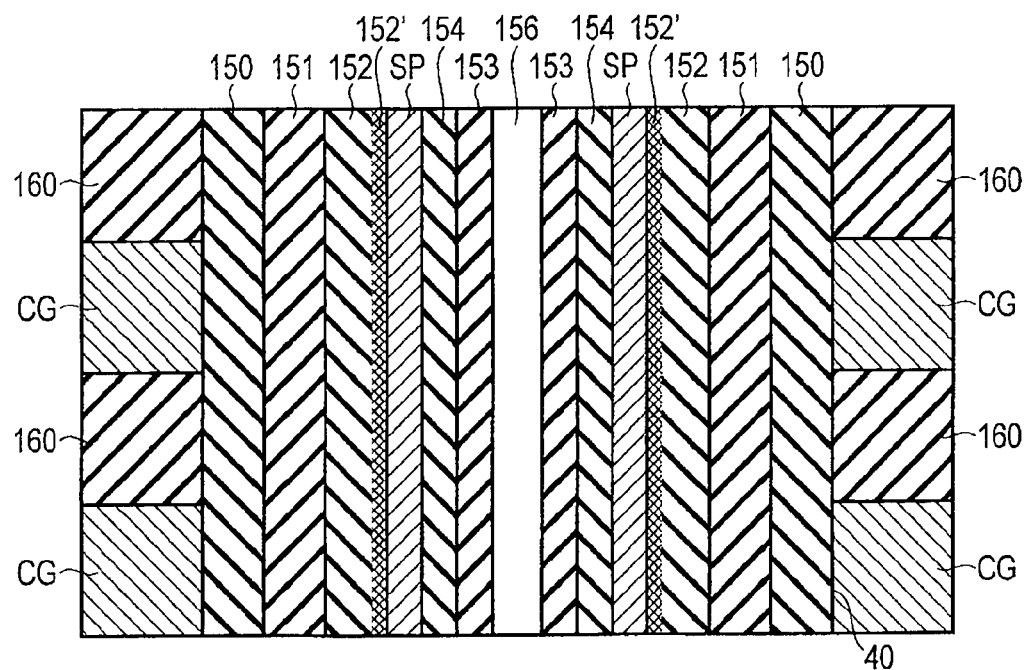
FIG. 4 is a sectional view of a MONOS memory cell according to the embodiment.

The structure of the MONOS memory cell according to this embodiment will be described with reference to FIG. 4. FIG. 4 is a sectional view showing the MONOS memory cell according to the embodiment.

As shown in FIG. 4, the MONOS memory cell comprises the control gates CG, interlayer dielectric films 160, the block insulating films 150, the charge storage layers 151, the tunnel insulating films 152, the silicon pillar SP, an oxide film 154, and the catalytic film 153.

The control gates CG and the interlayer dielectric films 160 are alternately stacked on the semiconductor substrate 30. The control gates CG and the interlayer dielectric films 160 have a memory hole (through hole) 40 extending through them from its upper surface to its low surface. In other words, the control gates CG and the interlayer dielectric films 160 have a memory hole 40 extending in the stacking direction. The memory hole 40 is formed to be perpendicular or tapered to the surface of the semiconductor substrate 30. The memory hole 40 has, for example, a circular planar shape. However, the embodiment is not limited to this, and the memory hole 40 may have an elliptical, square, or rectangular planar shape.

The block insulating film 150 is formed on the inner surface of the memory hole 40. That is, the block insulating film 150 is formed on the side surfaces of the control gates CG and those of the interlayer dielectric films 160 in the memory hole 40. The block insulating film 150 may be formed from, for example, layered films of $SiO_2$ (silicon oxide), SiN (silicon nitride), and $SiO_2$ sequentially formed on the inner surface of the memory hole 40 or a single-layered film of $SiO_2$ or SiN. The block insulating film 150 may be formed on the upper and lower surfaces of each control gate CG so as to serve as the interlayer dielectric film 160.

The charge storage layer 151 is formed on the block insulating film 150. That is, the charge storage layer 151 is formed on the side surface of the block insulating film 150 in the memory hole 40. The charge storage layer 151 is made of, for example, SiN.

The tunnel insulating film 152 is formed on the charge storage layer 151. That is, the tunnel insulating film 152 is formed on the side surface of the charge storage layer 151 in the memory hole 40. The tunnel insulating film 152 is made of, for example, $SiO_2$.

The tunnel insulating film 152 includes an oxide film 152' additionally formed later by oxidation on the interface of the silicon pillar SP to be described later. The oxide film 152' is formed from, for example, an $SiO_2$ film of 1 ML (Mono Layer) (inclusive) to 10 ML (inclusive). For this reason, the oxide film 152' is integrated with the tunnel insulating film 152. Note that since an $SiO_2$ film thickness of 1 ML corresponds to about 0.3 nm, the film thickness of the oxide film 152' is 0.3 nm (inclusive) to 3 nm (inclusive).

The silicon pillar SP is formed on the tunnel insulating film 152. That is, the silicon pillar SP is formed on the side surface of the tunnel insulating film 152 in the memory hole 40. The silicon pillar SP is made of, for example, polysilicon (Poly-Si) or amorphous silicon (a-Si).

The oxide film 154 is formed on the silicon pillar SP. That is, the oxide film 154 is formed on the side surface of the silicon pillar SP in the memory hole 40. The oxide film 154 is made of, for example, $SiO_2$.

The catalytic film 153 is formed on the oxide film 154. That is, the catalytic film 153 is formed on the side surface of the oxide film 154 in the memory hole 40. The catalytic film 153 contains a material having an oxygen dissociation catalytic action. That is, the catalytic film 153 has an oxidation enhancement (oxidation promotion) effect in the oxidation process to be described later. Oxidation through the catalytic film 153 allows to more quickly form thicker oxide films 152' and 154. Examples of the catalytic film 153 will be described later.

The hollow structure 156 is provided in the catalytic film 153 in the memory hole 40. The hollow structure 156 can either be filled with an insulating material such as $SiO_2$ or SiN or remain hollow. Alternatively, the hollow structure 156 may be filled with the self-aligned catalytic film 153.

Example 1

Example 1 of the catalytic film 153 will be described.

In Example 1 of the catalytic film 153, a metal oxide material such as a high-k insulating material is used as the material having the oxygen dissociation catalytic action. The high-k insulating material is conventionally used in the manufacturing process of semiconductor logic devices. Hence, the high-k insulating material enables relatively easy process integration.

An example of the metal oxide of the high-k insulating material is $HfO_2$ (hafnium oxide). $HfO_2$ is one of the materials which exhibit a highest performance in process integration. $HfO_2$ used as a high-k gate insulating film on an Si substrate is known to accelerate oxidation of the interface between the Si substrate and the high-k gate insulating film during annealing in an oxidizing atmosphere. Hence, $HfO_2$ is also applicable to accelerate oxidation on the reverse side (the interface between the silicon pillar SP and the tunnel insulating film 152) of the silicon pillar SP in the memory hole 40 according to the embodiment. Note that $ZrO_2$ (zirconium oxide) has elementary properties similar to those of $HfO_2$ and is usable in place of $HfO_2$.

Another example of the metal oxide is $La_2O_3$ (lanthanum oxide). Like $HfO_2$, $La_2O_3$ also has a property of enhancing oxidation of the interface layer. However, $La_2O_3$ is known to have strong hygroscopicity and changes its quality when simply exposed to the atmosphere. To stabilize $La_2O_3$, at least one of Al (aluminum) and Si is added to $La_2O_3$ to use it in the form of LaAlO (lanthanum aluminate), LaSiO (lanthanum silicate), LaAlSiO (lanthanum aluminosilicate), or the like. These materials are stable without hygroscopicity and also inherit the oxidation enhancement (interface layer formation) property exhibited by $La_2O_3$. These materials also have a property that exhibits a high band offset of the conduction band. For these reasons, when one of these materials is used as the catalytic film 153 in the memory hole 40, capture of high-energy electrons hardly occurs, and a high reliability can be obtained.

Note that not an oxide of Hf or Zr but an oxide of Al, Ti (titanium), Y (yttrium), Ta (tantalum), or W (tungsten) may be used. Alternatively, not an oxide of La but an oxide of a rare earth element such as Ce (cerium) may be used. A composite oxide, a layered oxide, or a silicate of Hf, Zr, Al, Ti, Y, Ta, W, La, or Ce may be used.

The metal oxide used in the catalytic film 153 preferably has oxygen deficiency. A material having oxygen deficiency means a material in which the content ratio of oxygen is lower than the stoichiometric ratio. A metal oxide having oxygen deficiency acts to dissociate oxygen and also has an effect of making the diffusion coefficient larger when the dissociated oxygen moves to the silicon pillar SP serving as a channel.

Example 2

Example 2 of the catalytic film 153 will be described.

In Example 2 of the catalytic film 153, a noble metal material is used as the material having the oxygen dissociation catalytic action. The noble metal material generally features a high oxygen dissociation effect. For example, Pt (platinum) formed on an Si substrate is known to cause oxygen dissociation (generate oxygen atoms) and grow an $SiO_2$ film on the interface even in low-temperature annealing at about 300° C. Hence, Pt is also applicable to accelerate oxidation on the reverse side (the interface between the silicon pillar SP and the tunnel insulating film 152) of the silicon pillar SP in the memory hole 40 according to the embodiment.

The noble metal material has conductivity. In this embodiment, however, the oxide film 154 is formed on the interface between the noble metal and the silicon pillar SP serving as a channel. For this reason, no electrical connection is formed between the channel and the noble metal. Hence, the formation of the noble metal does not affect the electrical characteristics of the channel.

Note that not Pt but Pd (palladium), Ir (iridium), Ru (ruthenium), Ag (silver), Rh (rhodium), Os (osmium), or Au (gold) may be used as the noble metal material.

[Manufacturing Method]

Figure 5:
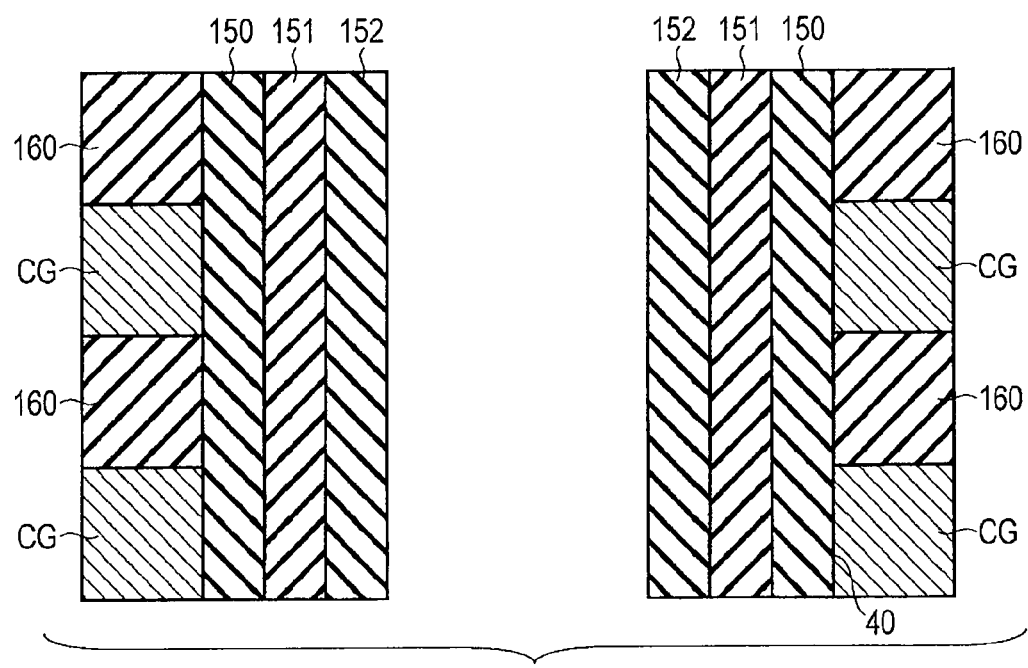
FIG. 5 is a sectional view showing a step in the manufacture of the MONOS memory cell according to the embodiment.
Figure 6:
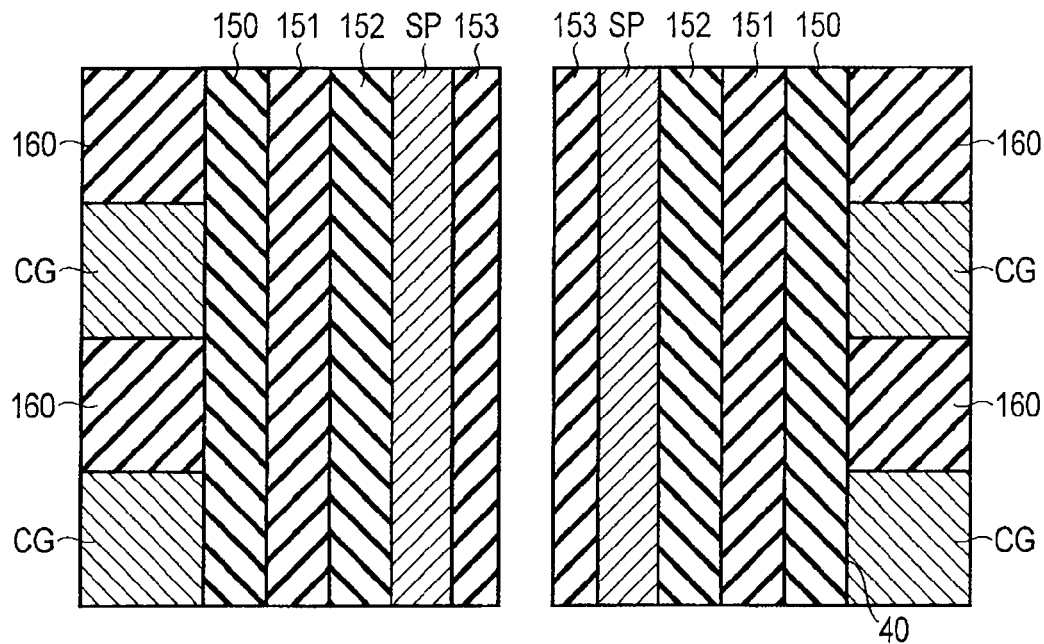
FIG. 6 is a sectional view showing a step in the manufacture of the MONOS memory cell according to the embodiment following FIG. 5.
Figure 7:
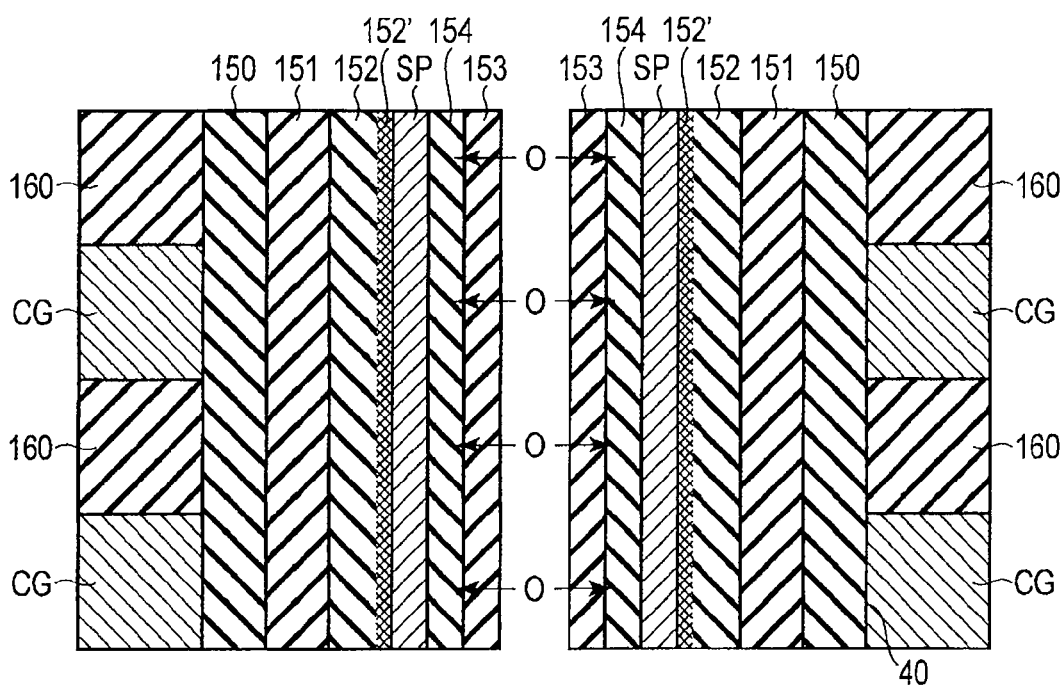
FIG. 7 is a sectional view showing a step in the manufacture of the MONOS memory cell according to the embodiment following FIG. 6.

A method of manufacturing the MONOS memory cell according to this embodiment will be described with reference to FIGS. 5, 6, and 7. FIGS. 5, 6, and 7 are sectional views showing steps in the manufacture of the MONOS memory cell.

First, as shown in FIG. 5, a memory hole 40 is formed in control gates CG and interlayer dielectric films 160 alternately stacked on a semiconductor substrate 30 so as to extend through the layers from the upper surface to the lower surface of the stack. The memory hole 40 has, for example, a circular planar shape and a diameter of about 70 nm. After that, a block insulating film 150 is formed on the inner surface of the memory hole 40. That is, the block insulating film 150 is formed on the side surfaces of the control gates CG and those of the interlayer dielectric films 160 in the memory hole. The block insulating film 150 may be formed from, for example, layered films of $SiO_2$ (silicon oxide), SiN (silicon nitride), and $SiO_2$ sequentially formed on the inner surface of the memory hole 40 or a single-layered film of $SiO_2$ or SiN.

Note that the process up to this point may be done in the following way.

First, doped silicon layers serving as the control gates CG and non-doped silicon layers (not shown) are formed on the semiconductor substrate 30. The memory hole 40 is then formed so as to extend through these layers from the upper surface to the lower surface of the stack. Wet etching is performed via the memory hole 40 to remove the non-doped silicon layers. After that, the block insulating film 150 is formed on the side surfaces of the control gates CG in the memory hole 40. At this time, the block insulating film 150 is formed on the upper and lower surfaces of the control gates CG, too. The block insulating film 150 is thus formed as the interlayer dielectric films 160.

Next, a charge storage layer 151 is formed on the block insulating film 150. That is, the charge storage layer 151 is formed on the side surface of the block insulating film 150 in the memory hole 40. The charge storage layer 151 is made of, for example, SiN.

A tunnel insulating film 152 is formed on the charge storage layer 151. That is, the tunnel insulating film 152 is formed on the side surface of the charge storage layer 151 in the memory hole 40. The tunnel insulating film 152 is made of, for example, $SiO_2$.

The total film thickness of the block insulating film 150, the charge storage layer 151, and the tunnel insulating film 152 is, for example, about 20 nm.

Next, as shown in FIG. 6, a silicon pillar SP is formed on the tunnel insulating film 152. That is, the silicon pillar SP is formed on the side surface of the tunnel insulating film 152 in the memory hole 40. The silicon pillar SP is made of, for example, polysilicon or amorphous silicon. The film thickness of the silicon pillar SP is, for example, about 7 nm.

A catalytic film 153 is formed on the silicon pillar SP. That is, the catalytic film 153 is formed on the side surface of the silicon pillar SP in the memory hole 40. The catalytic film 153 contains a material having an oxygen dissociation catalytic action.

A metal oxide material such as a high-k insulating material is used as the material having the oxygen dissociation catalytic action. As the metal oxide material, an oxide, a composite oxide, or a layered oxide of Hf, Zr, Al, Ti, Y, Ta, W, La, or Ce is used. Alternatively, a silicate of one of these materials is used.

As the material having the oxygen dissociation catalytic action, a noble metal material may be used. As the noble metal material, Pt, Pd, Ir, Ru, Ag, Rh, Os, or Au is used.

The catalytic film 153 is formed using various known methods. For example, ALD (Atomic Layer Deposition) or CVD (Chemical Vapor Deposition) is used. The catalytic film 153 is formed to a film thickness of, for example, about 3 to several nm. However, the embodiment is not limited to this, and the catalytic film 153 is formed so thick as not to fill the memory hole 40.

Next, as shown in FIG. 7, the interface between the silicon pillar SP and the tunnel insulating film 152 is oxidized through the catalytic film 153.

More specifically, annealing is performed in an oxidizing atmosphere from the inside of the catalytic film 153 in the memory hole 40. The oxidizing atmosphere is, for example, $O_2$, $O_3$, $H_2O$, $N_2O$, or a combination thereof. The annealing temperature is, for example, 600° C. (inclusive) to 900° C. (inclusive). The upper limit of the annealing temperature is determined considering not to degrade the tunnel insulating film 152 and not to generate SiO gas. The lower limit of the annealing temperature is determined considering to cause oxidation through polysilicon (silicon pillar SP). The annealing time is adjusted in consideration of the film thicknesses of the oxide films 152' and 154.

With this process, oxygen diffuses in each film to form the oxide film 152' on the interface between the silicon pillar SP and the tunnel insulating film 152. At this time, the oxide film 152' is formed from an $SiO_2$ film of 1 ML (Mono Layer) (inclusive) to 10 ML (inclusive). That is, the film thickness of the oxide film 152' is 0.3 nm (inclusive) to 3 nm (inclusive). For this reason, the oxide film 152' is integrated with the tunnel insulating film 152. In other words, with this process, the oxygen concentration in the interface between the silicon pillar SP and the tunnel insulating film 152 increases, and the film thickness added to the tunnel insulating film 152 is 0.3 nm (inclusive) to 3 nm (inclusive).

At the same time, the oxide film 154 is formed on the interface between the silicon pillar SP and the catalytic film 153. The oxide film 154 is made of, for example, $SiO_2$. The oxide film 154 is formed by partially oxidizing the silicon pillar SP. For this reason, the silicon pillar SP becomes thinner than upon formation. Note that the catalytic film 153 may partially be oxidized.

Note that the annealing in the oxidizing atmosphere is not limited to thermal oxidation. That is, not the thermal oxidation but plasma oxidation using a high frequency or microwaves may be performed based on, for example, $O_2$, $O_3$, $H_2O$, $N_2O$, or a combination thereof.

When a noble metal material is used as the catalytic film 153, the annealing temperature need not always be 600° C. or more and can be, for example, about 300° C. This is because the noble metal material has a higher oxygen dissociation effect, and noble metal material formation on the Si substrate causes sufficient oxygen dissociation (oxygen atom generation) even in annealing at about 300° C.

When a metal oxide is used as the catalytic film 153, the catalytic film 153 may be annealed in a nonoxidizing atmosphere before annealing in an oxidizing atmosphere. The nonoxidizing atmosphere is, for example, $N_2$. This allows to form a metal oxide including oxygen deficiency. At this time, the annealing temperature is preferably higher than the temperature of annealing in the oxidizing atmosphere to be performed later. This makes it possible to maintain, during the annealing in the oxidizing atmosphere, the oxygen deficiency formed by the annealing in the nonoxidizing atmosphere and thus speed up oxygen diffusion.

After the hollow structure 156 in the catalytic film 153 in the memory hole 40 is filled with an insulating material such as $SiO_2$ or SiN or while keeping the structure hollow, as shown in FIG. 4, an insulating film (not shown) is formed on the entire surface. Note that the hollow structure 156 may be filled with the catalytic film 153 that causes self alignment during annealing in the oxidizing atmosphere. In this way, the MONOS memory cell according to this embodiment is formed.

[Effects]

According to the above-described embodiment, in the method of manufacturing the 3D-stacked memory, the catalytic film 153 having the oxygen dissociation catalytic action is formed on the inner surface of the silicon pillar SP. After that, the interface between the silicon pillar SP and the tunnel insulating film 152 is oxidized through the catalytic film 153. Oxidizing the interface between the silicon pillar SP and the tunnel insulating film 152 allows to suppress the decrease in the mobility of channel carriers and degradation of reliability of the tunnel insulating film caused by oxygen deficiency near the interface. Furthermore, in the embodiment, oxidation is done through the catalytic film 153. Hence, the following effects can be obtained.

FIGS. 8(a) and 8(b) are views showing the oxidation enhancement effect obtained by the catalytic film 153 according to the embodiment and a comparative example thereof. More specifically, FIG. 8(a) is a view showing a comparative example in which the oxidation process is performed without the help of the catalytic film 153. FIG. 8(b) is a view showing an example in which the oxidation process is performed through the catalytic film 153. These processes are performed under the same oxidation conditions (temperature, time, and the like).

In the oxidation according to this embodiment shown in FIG. 8(b), the oxide film 154 thicker than in the comparative example shown in FIG. 8(a) is formed between the silicon pillar SP and the catalytic film 153. This is because the catalytic film 153 has the oxygen dissociation catalytic action, and under the same oxidation conditions, the speed of oxidation of the interface between the silicon pillar SP and the catalytic film 153 therefore becomes higher with the catalytic film 153. This also applies to the oxide film 152' located on the interface between the silicon pillar SP and the tunnel insulating film 152. That is, the speed of oxidation of the oxide film 152' is higher with the catalytic film 153 than that without the catalytic film 153 under the same oxidation conditions.

Hence, in this embodiment, it is possible to lower the temperature and shorten the time concerning the oxidation conditions. That is, the thermal budget placed on the device by annealing in the oxidation process can be reduced. Especially in the 3D memory, the oxidation process is performed at the end of the MONOS memory cell manufacturing process. For this reason, the annealing affects the whole memory cells in the conventional 3D memory manufacturing process. In this embodiment, the thermal budget of annealing can be reduced to improve the characteristics of whole memory cells.

Furthermore, according to the embodiment, the oxidation process can be done in a short time. This allows to improve the productivity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a substrate;
    a conductive film formed above the substrate and serving as a control gate having a hole extending from an upper surface of the conductive film to a lower surface of the conductive film;
    a block insulating film in the hole, formed on an inner side surface of the conductive film defining the hole;
    a charge storage layer in the hole, formed on an inner side surface of the block insulating film;
    a tunnel insulating film in the hole, formed on an inner side surface of the charge storage layer;
    a semiconductor layer in the hole, formed on an inner side surface of the tunnel insulating film;
    an oxide film in the hole, formed on an inner side surface of the semiconductor layer; and
    a film in the hole, formed on an inner side surface of the oxide film and containing a material having an oxygen dissociation catalytic action.

2. The device of claim 1, wherein the material is a metal oxide material.

3. The device of claim 2, wherein the metal oxide material is one material selected from the group consisting of oxides, composite oxides, layered oxides, and silicates of Hf, Zr, Al, Ti, Y, Ta, W, La, and Ce.

4. The device of claim 2, wherein the metal oxide material has oxygen deficiency.

5. The device of claim 1, wherein the material is a noble metal.

6. The device of claim 5, wherein the noble metal is one element selected from the group consisting of Pt, Pd, Ir, Ru, Ag, Rh, Os, and Au.

* * * * *